United States Patent [19]

Cook

[11] 4,308,078
[45] Dec. 29, 1981

[54] METHOD OF PRODUCING SINGLE-CRYSTAL SEMICONDUCTOR FILMS BY LASER TREATMENT

[76] Inventor: Melvin S. Cook, 43 Westerly Rd., Saddle River, N.J. 07458

[21] Appl. No.: 156,879

[22] Filed: Jun. 6, 1980

[51] Int. Cl.$^3$ .......................................... H01L 21/263
[52] U.S. Cl. ....................................... 148/1.5; 148/33; 148/187; 156/616 R; 357/30; 357/91
[58] Field of Search ........................... 148/1.5, 187, 33; 357/91, 30; 156/616 R

[56] References Cited

U.S. PATENT DOCUMENTS 3,585,088  6/1971  Schwuttke et al. .................. 148/174
4,187,126  2/1980  Radd et al. ............................ 148/1.5
4,234,358  11/1980 Celler .................................... 148/1.5

*Primary Examiner*—Upendra Roy

*Attorney, Agent, or Firm*—Gottlieb, Rackman & Reisman

[57] ABSTRACT

A method is disclosed for producing single-crystal semiconductor films. A thin layer of semiconductor single-crystal material is grown on a substrate having a lower melting point temperature than the layer material. The substrate and layer are heated in an oven to the melting point temperature of the substrate. Laser radiation of a wavelength absorbed by the layer is impinged on the layer, thereby generating heat in the layer and raising its temperature. Heat then flows to the substrate where it is absorbed, as is any transmitted radiation. Liquification of substrate material at the interface of the substrate with the layer results. Following such liquification, the layer is locally separated from the substrate. As the laser radiation is swept along the layer, the layer (film) is progressively removed from the substrate, until the film is entirely separated.

8 Claims, 2 Drawing Figures

METHOD OF PRODUCING SINGLE-CRYSTAL SEMICONDUCTOR FILMS BY LASER TREATMENT

This invention relates to a low-cost method of producing single-crystal semiconductor films. It can be used, for example, to produce thin single-crystal films of semiconductor materials for use in manufacturing integrated circuits and solar cells.

CROSS-REFERENCES TO RELATED APPLICATIONS

In my co-pending application entitled "METHOD OF PRODUCING THIN SINGLE-CRYSTAL SHEETS", Ser. No. 127,114, filed on Mar. 4, 1980, which application is hereby incorporated by reference, a method is disclosed for producing thin sheets of crystal, and in my co-pending application entitled "METHOD OF PRODUCING THIN SINGLE-CRYSTAL SHEETS WITH P-N JUNCTIONS", Ser. NO. 146,104, filed on May 2, 1980, which application is hereby incorporated by reference, a method is disclosed for producing thin semiconductor crystals with surface p-n junctions formed on them.

These co-pending applications describe the prior art and offer low-cost solutions to certain problems with the prior art. The methods disclosed in these co-pending applications, however, require transmission of laser radiation through a substrate or a layer, and it may not be always convenient to arrange the combination of material properties and laser wavelength such that this can be accomplished with perfection.

It is an object of my invention to provide a low-cost method of producing thin sheets of semiconductor materials.

It is a further object of my invention to provide a low-cost method of producing thin sheets of single-crystal semiconductor materials.

It is a further object of my invention to provide a low-cost method of producing thin sheets of semiconductors with surface p-n junctions.

It is a further object of my invention to provide a low-cost method of producing thin sheets of single-crystal semiconductors with surface p-n junctions.

BRIEF SUMMARY OF THE INVENTION

Briefly, in accordance with the principles of my invention and in the preferred embodiment thereof, a thin (e.g., 10 micrometer thick) layer of single-crystal semiconductor material is grown on a substrate composed of lower melting point temperature material. In a particular example, the layer may be composed of gallium aluminum arsenide and the substrate may be composed of gallium arsenide. Techniques for such growth are well-known in the art and include, for example, liquid phase epitaxy, vapor phase epitaxy, and molecular beam epitaxy.

The substrate and layer are heated to just below the melting point temperature of the substrate. This may be done in an oven, for example. Laser radiation of a wavelength absorbed by the layer is then impinged on a region of the layer, thus generating heat in the layer, and thereby raising its temperature. As a result, heat flows to the substrate, where it is absorbed along with any radiation transmitted through the layer to the substrate. As the substrate was in the vicinity of its melting point temperature, such heat absorption will cause liquification of substrate material at the interface of the layer and the substrate. This allows local separation of the layer (film) from the substrate. As the region onto which the laser radiation is impinged is swept across the layer, the film is progressively separated from the substrate, until it is entirely separated. As the film is above its own melting point temperature, the process can proceed without destroying the structural integrity of the film.

If the layer has been grown as n-type or p-type material adjacent the substrate, and if the substrate adjacent the layer includes material which, if incorporated in the layer material, would render it p-type or n-type, respectively, then the liquid formed will introduce material to the film which is derived from the substrate and which may give rise to a surface p-n junction on ths separated film, as described in my latter co-pending application.

As in my co-pending application, the term 'junction' as used herein includes both homojunction and heterojunction.

An advantage of my method is that the substrate is reusable, with successive layers being formed on it, if desired, until it is consumed beyond the point of useability.

BRIEF DESCRIPTION OF THE SEVERAL VIEWS OF THE DRAWINGS

Further objects, features, and advantages of my invention will become apparent upon consideration of the following detailed description in conjunction with the drawing, in which.

DETAILED DESCRIPTION

Figure 1:
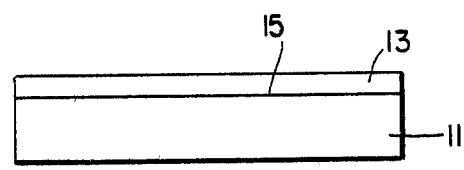
FIG. 1 is a schematic representation of a layer formed on a substrate.

In FIG. 1, substrate 11 is shown with layer 13 formed on it. The layer and the substrate meet at interface 15. The layer has a higher melting point temperature than the substrate.

Possible combinations of layer and substrate materials include aluminum gallium arsenide on gallium arsenide, and gallium arsenide on germanium, for example.

If it is desired to produce single-crystal film, then the substrate should, preferably, have a single crystal structure, and the lattices of the layer and substrate should be well-matched, as is well-known in the art. The surface of the substrate should be defect-free if single-crystal product is desired.

Figure 2:
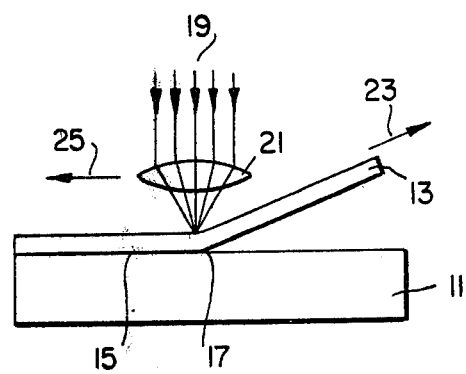
FIG. 2 is a schematic representation of a layer being separated from a substrate.

In FIG. 2, laser radiation 19 is focused by optical system 21 onto layer 13, where it is absorbed. Part of the impinging radiation may pass through to the substrate where it will be absorbed. As the temperature of the layer increases due to absorption of radiation, heat will flow to the substrate. If the substrate is sufficiently heated, liquification of substrate material at the interface 15 will occur.

In order to minimize the amount of laser radiation that is required to achieve such liquification, the substrate and layer can be heated to or near the melting point temperature of the substrate material. Such preliminary heating can be accomplished by conventional means as in an oven, for example. While the oven is not shown, any of conventional ovens may be used.

While laser radiation has been shown in connection with FIG. 2, other sources of radiation may be employed. For example, the radiation from an arc lamp can be used to generate heat in the layer so as to develop liquified material at the interface.

Liquification of material at the interface allows local separation of the layer from the substrate by pulling on the layer in the direction 23. The means employed to pull on the layer is not shown, but any of conventional means may be used for this purpose.

As the laser radiation and optical system are moved in direction 25 relative to the substrate, the layer can be progressively removed from the substrate. The means used to produce such relative motion are not shown, but conventional means may be used to produce such relative motion.

The substrate may be used in the form of a long ribbon, so that the product film will also be in the form of a long ribbon. For example, a germanium ribbon may be grown by means of edge-defined crystal growth or by using the web-dendritic method. The ribbon may be used in a quasi-continuous process, such that as layer material is grown onto one portion of the substrate ribbon, it is being removed from another portion of the ribbon.

As described in my latter co-pending application, a surface p-n junction can be produced in the separated film (layer) under certain conditions. If the layer is formed such that n-type or p-type material is in the vicinity of the interface 15, than if material derived from the liquified substrate material in the surface region of the film produces p-type or n-type material, respectively, a surface p-n junction will have been formed as one result of the separation process.

Although the invention has been described with reference to particular embodiments, it is to be understood that these embodiments are merely illustrative of the application of the principles of the invention. Numerous modifications may be made therein and other arrangements may be devised without departing from the spirit and scope of the invention.

What I claim is:

1. A method of producing thin crystals comprising the steps of epitaxially growing a layer of crystal on a substrate, said substrate being composed of material having a lower melting point temperature than that of the material composing said layer of crystal, directing radiation to which said layer of crystal is absorptive onto a region of said layer of crystal such that its temperature rises and heat flows to said substrate so that substrate material only at the interface with said layer of crystal liquifies, and separating said layer of crystal from said substrate at said liquified material.

2. A method in accordance with claim 1 wherein said radiation is laser radiation.

3. A method in accordance with claim 1 wherein said layer of crystal is grown with a single-crystal structure.

4. A method in accordance with claim 3 wherein said radiation is laser radiation.

5. A method in accordance with claim 1 wherein said layer of crystal is composed of semiconductor crystal of one semiconductor type adjacent to its interface with said substrate, and said substrate includes material which renders said semiconductor crystal of opposite type such that a p-n junction is formed after said separation.

6. A method in accordance with claim 5 wherein said layer of crystal is grown with a single-crystal structure.

7. A method in accordance with claim 5 wherein said radiation is laser radiation.

8. A method in accordance with claim 7 wherein said layer of crystal is grown with a single-crystal structure.

* * * * *